(12) United States Patent
Tanaka

(10) Patent No.: US 8,836,150 B2
(45) Date of Patent: Sep. 16, 2014

(54) SEMICONDUCTOR DEVICE

(75) Inventor: Hiroaki Tanaka, Nagakute (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/989,962

(22) PCT Filed: Nov. 29, 2010

(86) PCT No.: PCT/JP2010/071240
§ 371 (c)(1),
(2), (4) Date: May 28, 2013

(87) PCT Pub. No.: WO2012/073302
PCT Pub. Date: Jun. 7, 2012

(65) Prior Publication Data
US 2013/0241084 A1    Sep. 19, 2013

(51) Int. Cl.
*H01L 23/498*    (2006.01)
*H01L 23/00*    (2006.01)
*H01L 29/739*    (2006.01)
*H01L 29/417*    (2006.01)

(52) U.S. Cl.
CPC ..... *H01L 23/498* (2013.01); *H01L 2224/04042* (2013.01); *H01L 2924/13055* (2013.01); *H01L 24/05* (2013.01); *H01L 24/85* (2013.01); *H01L 2224/48132* (2013.01); *H01L 2224/48491* (2013.01); *H01L 24/48* (2013.01); *H01L 29/7397* (2013.01); *H01L 2224/05624* (2013.01); *H01L 2224/4847* (2013.01); *H01L 2224/48091* (2013.01); *H01L 2924/3511* (2013.01); *H01L 2224/451* (2013.01); *H01L 2224/49175* (2013.01); *H01L 29/417* (2013.01); *H01L 29/41741* (2013.01); *H01L 2924/00014* (2013.01); *H01L 2224/85205* (2013.01); *H01L 2224/05557* (2013.01)

USPC .......... 257/784; 257/578; 257/584; 257/773; 257/786

(58) Field of Classification Search
CPC ... H01L 23/498; H01L 23/4824; H01L 23/48; H01L 29/40; H01L 29/41; H01L 29/41708; H01L 29/66325; H01L 29/7397; H01L 29/7393; H01L 29/7395; H01L 2924/13055
USPC .......................... 257/578, 584, 773, 784, 786
See application file for complete search history.

(56) References Cited

U.S. PATENT DOCUMENTS

| 5,592,026 A | 1/1997 | Frisina et al. |
| 2004/0016979 A1* | 1/2004 | Kawano et al. ............... 257/401 |
| 2007/0023911 A1 | 2/2007 | Moriyama |

FOREIGN PATENT DOCUMENTS

| JP | S6119136 A | 1/1986 |
| JP | 6-216188 A | 8/1994 |
| JP | 7-201908 A | 8/1995 |
| JP | 2000-323519 A | 11/2000 |
| JP | 2002-222826 A | 8/2002 |
| JP | 2003-257696 A | 9/2003 |
| JP | 2004111885 A | 4/2004 |
| JP | 2007-035909 A | 2/2007 |
| JP | 2010-062362 A | 3/2010 |

* cited by examiner

Primary Examiner — Peniel M Gumedzoe
(74) Attorney, Agent, or Firm — Kenyon & Kenyon LLP

(57) ABSTRACT

A semiconductor device disclosed in this description has a semiconductor substrate including an element region in which a semiconductor element is formed, and an upper surface electrode formed on an upper surface of the element region of the semiconductor substrate. The upper surface electrode has a first thickness region and a second thickness region which is thicker than the first thickness region, and a bonding wire is bonded on the second thickness region.

3 Claims, 5 Drawing Sheets

SEMICONDUCTOR DEVICE

This is a 371 national phase application of PCT/JP2010/071240 filed 29 Nov. 2010, the contents of which are incorporated herein by reference.

TECHNICAL FIELD

The technology in the present application relates to a semiconductor device.

BACKGROUND ART

In order to electrically connect an upper surface electrode formed on an upper surface of a semiconductor substrate and an external terminal, a bonding wire is bonded to the upper surface of the upper surface electrode. In the bonded portion on the upper surface electrode, the upper surface electrode and the semiconductor substrate under the bonded portion may in some cases be damaged because of stress generated when bonding wire is bonded. To prevent damage of the upper surface electrode and the semiconductor substrate due to the stress generated in the bonded portion, Japanese Patent Application Publication No. H7-201908 (patent document 1), for example, discloses that a cell region where a semiconductor element is formed and a dummy cell region where a semiconductor element is not formed are mixed, and a bonding wire is bonded to a surface electrode in a portion formed on the upper surface of the dummy cell region. Thereby damage of the cell region can be controlled. According to Japanese Patent Application Publication No. 2002-222826 (patent document 2), thickness of the entire upper surface electrode is increased to relax the stress generated in a bonded portion.

CITATION LIST

Patent Literature

Patent Document 1: Japanese Patent Application Publication No. H7-201908
Patent Document 2: Japanese Patent Application Publication No. 2002-222826

SUMMARY OF INVENTION

Technical Problem

If a dummy cell region is created for bonding, as in the case of Japanese Patent Application Publication No, H7-201908, a ratio of a cell region with respect to the substrate area of the semiconductor substrate decreases, and the size of the semiconductor device increases. If the thickness of the entire upper surface electrode is increased as in the case of Japanese Patent Application Publication No. 2002-222826, the semiconductor wafer tends to warp during the steps of manufacturing the semiconductor device, because the thermal expansion coefficient of the upper surface electrode and that of the semiconductor substrate are different, therefore defects tend to occur.

Solution to Technical Problem

A semiconductor device disclosed in this description has a semiconductor substrate including an element region in which a semiconductor element is formed, and an upper surface electrode formed on an upper surface of the element region of the semiconductor substrate. The upper surface electrode has a first thickness region and a second thickness region which is thicker than the first thickness region, and a bonding wire is bonded on the second thickness region.

In the semiconductor device, the bonding wire is bonded on the second thickness region of the upper surface electrode, which is formed on the upper surface of the element region of the semiconductor substrate. Since the second thickness region is thicker than the first thickness region, stress, generated on the second thickness region due to bonding the bonding wire, is relaxed, and damage to the semiconductor device can be suppressed. Even if the bonding wire is bonded on the upper surface electrode formed on the surface of the element, damage to the semiconductor device can be suppressed. The upper surface electrode has the first thickness region that is thinner than the second thickness region, therefore the generation of warp of a semiconductor wafer during the steps of manufacturing the semiconductor device can be suppressed.

A slit portion may be provided at a boundary between the first thickness region and the second thickness region, and the upper surface electrode of the slit portion may be thinner than the upper surface electrode of the first thickness region. If the slit portion is provided, generation of warp of a semiconductor during the steps of manufacturing the semiconductor device can be further suppressed by the slit portion.

DESCRIPTION OF EMBODIMENTS

A semiconductor device disclosed in this description has: a semiconductor substrate including an element region in which a semiconductor element is formed; and an upper surface electrode formed on an upper surface of the element region of the semiconductor substrate. The upper surface electrode has a first thickness region and a second thickness region. The upper surface electrode in the second thickness region is thicker than the upper surface electrode in the first thickness region. A bonding wire is bonded on at least a part of the upper surface of the upper surface electrode in the second thickness region. The upper surface electrode is not limited to a special electrode only if a bonding wire can be bonded on the upper surface of the electrode, and may be an electrode formed on the upper surface of a main cell region of the semiconductor substrate, or may be an electrode formed on the upper surface of a sense cell region. If the semiconductor device has a plurality of upper surface electrodes on which a bonding wire is bonded, it is preferable that each of the upper surface electrodes on which a bonding wire is bonded has a first thickness region and a second thickness region. Required in this case is that, in a plan view of the semiconductor device, a bonding region, in which the upper surface electrode and the bonding wire are bonded, is included in the second thickness region. If the upper surface electrode has a plurality of second thickness regions, a bonding wire may be bonded on the upper surface of at least one second thickness region out of the plurality of second thickness regions, or bonding wires may be bonded on the upper surfaces of all the second thickness surfaces respectively. The shape of the bonding wire may be linear, such as a metal line, or may be a tape or ribbon. The semiconductor device is a semiconductor device where a bonding wire is bonded on the upper electrode, and is not restricted by the type of semiconductor element (e.g. IGBT, MOS, diode) that is formed on the semiconductor substrate.

EXAMPLE 1

Figure 1:
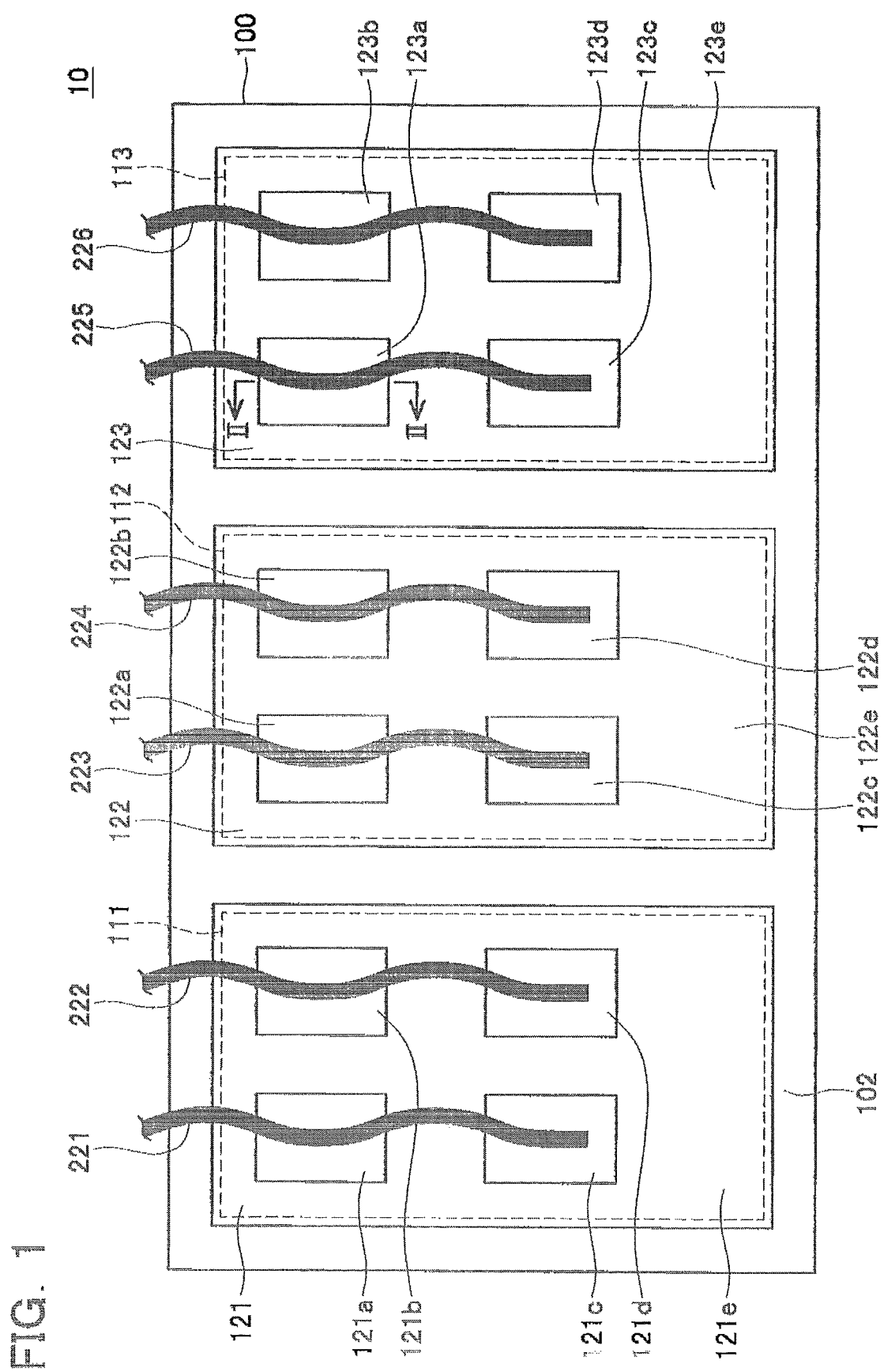
FIG. 1 is a plan view of a semiconductor device according to Example 1, and shows a state of a bonding wire being bonded on an upper surface electrode.
Figure 2:
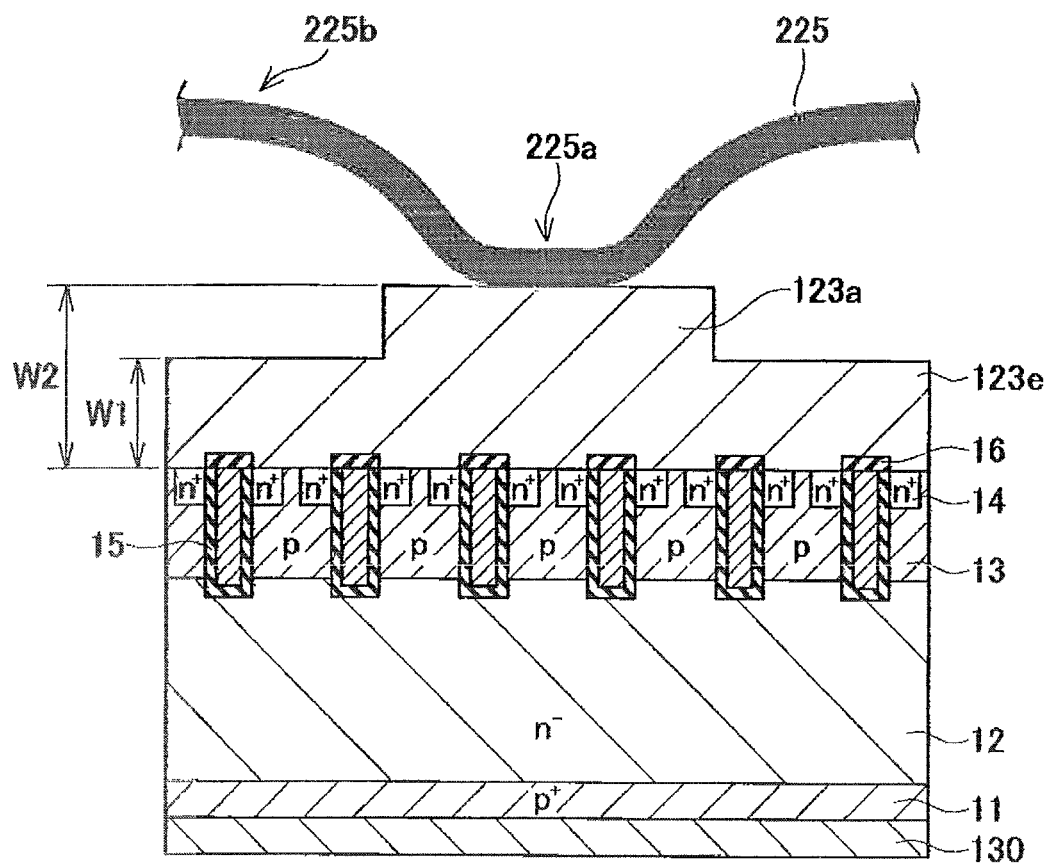
FIG. 2 is a cross-sectional view sectioned at the II-II line in FIG. 1.

As shown in FIG. 1 and FIG. 2, a semiconductor device 10 has: a semiconductor substrate 100; upper surface electrodes 121 to 123 formed on the upper surface of a semiconductor substrate 100; and a rear surface electrode 130 formed on a rear surface of the semiconductor substrate 100. The principal component of the upper surface electrodes 121 to 123 and the rear surface electrode 130 is metal. The semiconductor substrate 100 includes a plurality of main cell regions 111 to 113 in which a semiconductor element is formed, and a non-cell region 102 in which a semiconductor element is not formed. The upper surface electrodes 121 to 123 are formed on the upper surfaces of the main cell regions 111 to 113 respectively. A part of the upper surface electrodes 121 to 123 may extend to the upper surface of the non-cell region 102. A gate pad is disposed on the upper surface of the semiconductor device 10, and a small signal pad, such as a sense pad, may also be disposed, although this is not illustrated.

As shown in FIG. 2, a trench gate type IGBT is formed in the main cell region 113 of the semiconductor substrate 100. In the main cell region 113, a collector layer 11, a drift layer 12 and a body layer 13 are provided sequentially from the rear surface side, and an emitter layer 14 is formed in a part of the upper surface of the body layer 13. The body layer 13 and the emitter layer 14 are electrically connected with the upper surface electrode 123. A trench gate 15 penetrates through the emitter layer 14 and the body layer 13 from the upper surface side of the semiconductor substrate 100, and reaches the drift layer 12. A gate electrode coated with insulation film is filled inside the trench gate 15. The gate electrode is insulated from the upper surface electrode 123 by an insulation film 16. A trench gate type IGBT is also formed in the main cell regions 111 and 112, just like the main cell region 113. The upper surface electrodes 121 to 123 are the main emitter electrodes of the main cell regions 111 to 113 respectively.

The surface electrodes 121 to 123 have second thickness regions 121a to 121d, 122a to 122d and 123a to 123d, and first thickness regions 121e, 122e and 123e respectively. Bonding wires 221 to 226 are bonded on the upper surfaces of the second thickness regions 121a to 121d, 122a to 122d and 123a to 123d respectively. The bonding wires 221 to 226 are metal wires. Each of the second thickness regions 121a to 121d, 122a to 122d and 123a to 123d is rectangular in a plan view of the semiconductor device. The bonding wires 221 to 226 are bonded to the center of the upper surfaces of the second thickness regions 121a to 121d, 122a to 122d and 123a to 123d respectively. The bonding wire 221 is bonded on the upper surfaces of the second thickness region 121a and the second thickness region 121c located under the bonding wire 221 respectively, and is curved up in an area between the second thickness region 121a and the second thickness region 121c. In the same manner, the bonding wires 222 to 226 are bonded to the upper surfaces of the second thickness regions 121b, 121d, 122a to 122d and 123a to 123d, located under the bonding wires 222 to 226 respectively, and are curved up in areas between the second thickness regions on which the bonding wires are bonded respectively. The bonding wire is not bonded to the first thickness regions 121e, 122e and 123e. The thickness W2 of the upper surface electrode in the second thickness region 121 is thicker than the thickness W1 of the upper surface electrode in the first thickness region 122 (W2>W1).

Figure 3:
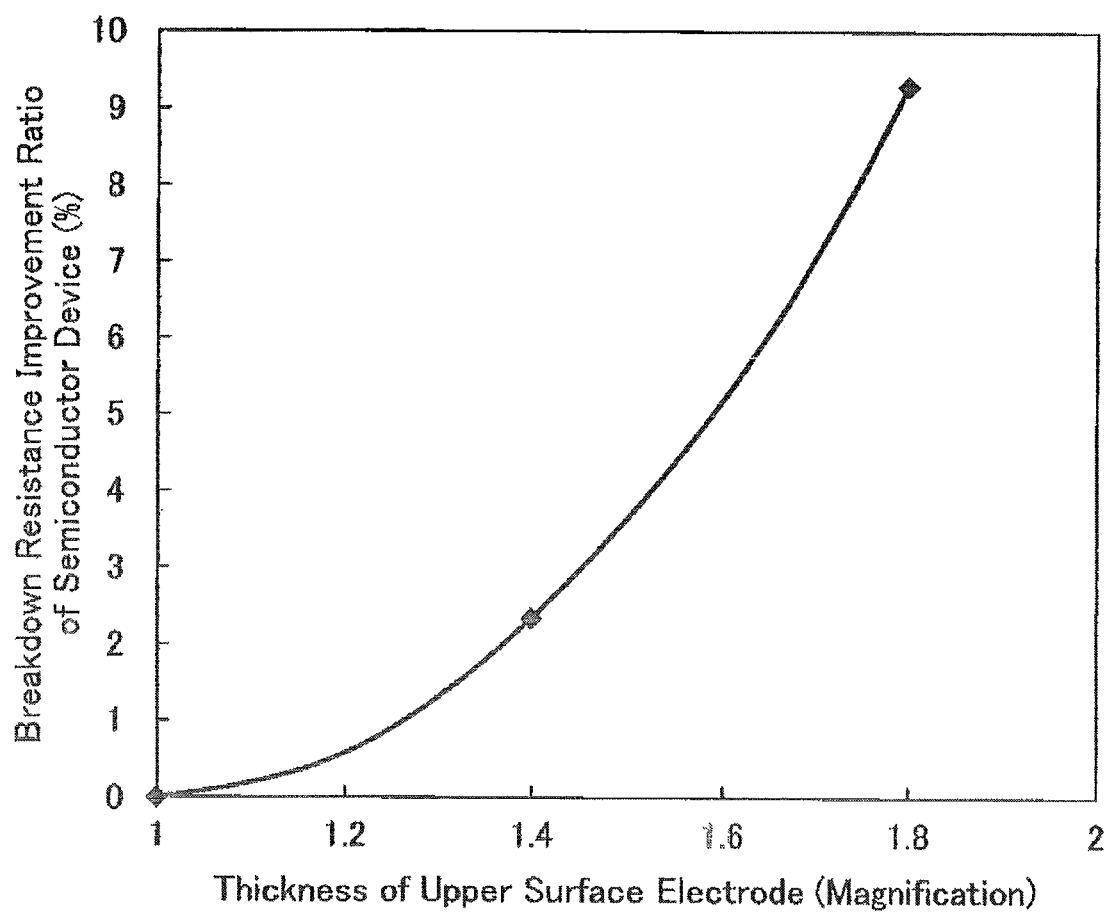
FIG. 3 shows a relationship between a thickness of the upper surface electrode and the element breakdown resistance improvement ratio of the semiconductor device.

FIG. 3 shows the result of testing the relationship between the thickness of the upper surface electrode and the breakdown resistance improvement ratio of the semiconductor device. The aluminum electrode is used for the upper surface electrode, and the bonding wire is bonded on the upper surface of the upper surface electrode formed on the upper surface of the element region of the semiconductor substrate using an ultrasonic bonding technique. The abscissa indicates the thickness of the upper surface electrode, and is the ratio with respect to the thickness of a conventional upper surface electrode. The ordinate indicates the element breakdown resistance improvement ratio of the semiconductor device. The element breakdown resistance improvement ratio is a numeric value (%) determined by dividing the ratio of the number of elements broken down in the semiconductor device of which upper surface electrode has a predetermined thickness, by the ratio of the number of elements broken down in the semiconductor device of which upper surface electrode has a conventional thickness in a case where wire bonding is implemented at a predetermined bonding pressure. As FIG. 3 shows, the element breakdown resistance improvement ratio of the semiconductor device increases as the thickness of the upper surface electrode increases. For example, if the thickness of the upper surface electrode is 1.4 times, the element breakdown resistance improvement ratio increases by 2%, and if the thickness of the upper surface electrode is 1.8 times, the element breakdown resistance improvement ratio increases by 9%. The result shown in FIG. 3 indicates that the effect to relax the stress, which is generated in an area of the upper surface electrode on which the bonding wire is bonded, increases, and the clement breakdown resistance improvement ratio of the semiconductor device increases, as the thickness of the upper surface electrode increases.

On the other hand, if the thickness of the entire upper surface electrode increases, the semiconductor wafer tends to warp during the steps of manufacturing the semiconductor device, because the thermal expansion coefficient of the upper surface electrode and that of the semiconductor substrate are different, therefore defects tend to occur. Recently there is a striking tendency that the thickness of a semiconductor wafer is decreasing, and in some cases, the thickness is decreased down to 100 to 200 μm. As the thickness of the semiconductor wafer decreases, the semiconductor wafer warps more easily.

In this example, the second thickness region of the upper surface electrode is thicker than the first thickness region of the upper surface electrode, therefore the stress generated in the second thickness region is relaxed. The upper surface electrode has a first thickness region which is thinner than the second thickness region, so the generation of warp in the semiconductor wafer during the steps of manufacturing the semiconductor device is suppressed. In other words, both an improvement in the element breakdown resistance of the semiconductor device and a suppression of the generation of warp of the semiconductor wafer can be implemented. The stress generated in the second thickness region of the semiconductor device is relaxed, which allows bonding the bonding wire on the upper surface electrode formed on the upper surface of the element region, and downsizing the semiconductor device.

In the case of bonding the bonding wire by ultrasonic bonding, it is preferable that W2/W1 is 1.2 or more in order to increase the strength of bonding. In terms of ease of manufacturing the upper surface electrode, it is preferable that W2/W1 is 2.0 or less.

Figure 4:
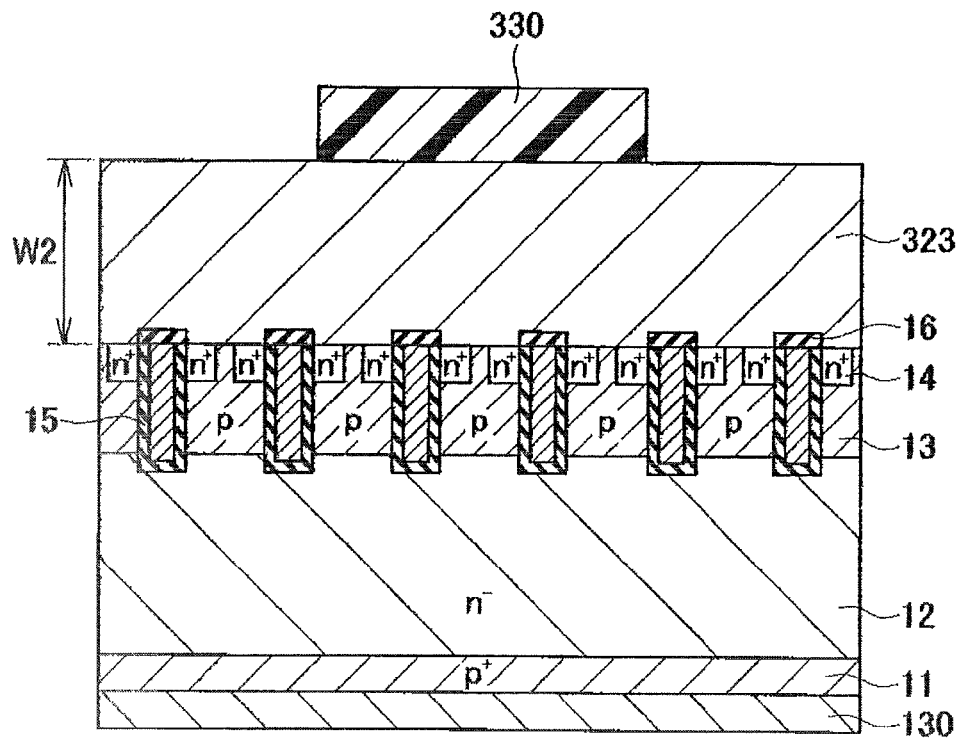
FIG. 4 is a diagram depicting a method for manufacturing the semiconductor device according to Example 1.
Figure 5:
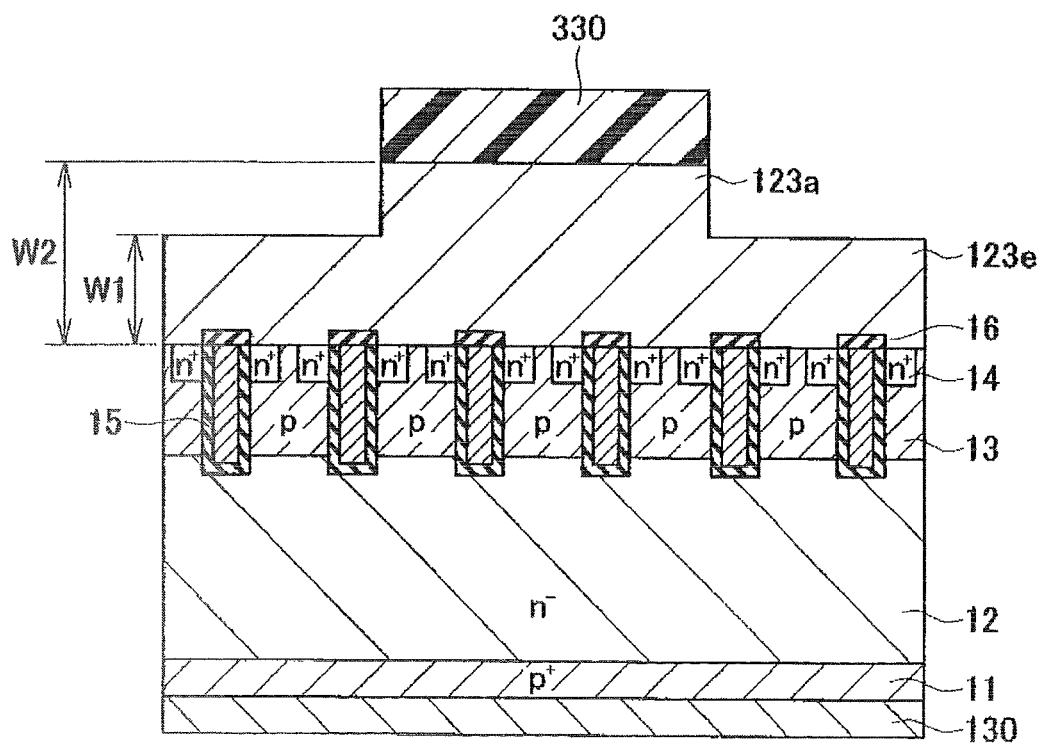
FIG. 5 is a diagram depicting a method for manufacturing the semiconductor device according to Example 1.

An upper surface electrode 123 having a second thickness region 123a of which thickness is W2 and a first thickness region 123e of which thickness is W1 can easily be manufactured by the manufacturing method shown in FIG. 4 and FIG. 5. First as FIG. 4 shows, an upper surface electrode film 323, of which thickness is uniformly W2, is formed on the upper surface of the semiconductor substrate 100. Then a patterned resist 330 is formed so as to cover the second thickness region 123a of the upper surface electrode film 323. If etched in this state, the upper surface electrode film 323 of the portion that is not covered by resist 330 (portion to be the first thickness region 123e) is removed. Thereby the second thickness region 123a of which thickness is W2 and the first thickness region 123e of which thickness is W1 can be formed as shown in FIG. 5.

Modification

Figure 6:
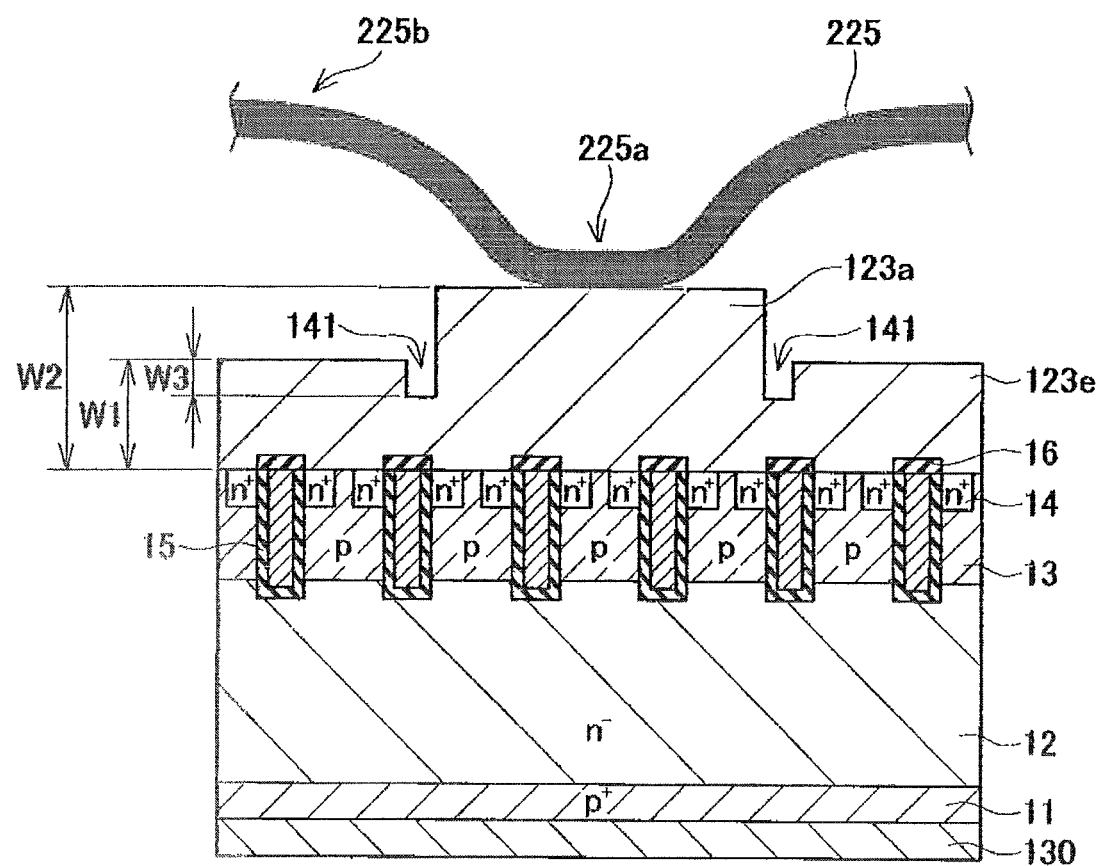
FIG. 6 is a cross-sectional view depicting a semiconductor device according to a modification.

As shown in FIG. 6, a slit portion 141 may be formed in the boundary between the first thickness region 123e and the second thickness region 123a. The slit portion 141 may be formed in a part of the boundary between the first thickness region 123e and the second thickness region 123a, or may be formed in the entire boundary between the first thickness region 123e and the second thickness region 123a so as to surround the second thickness region 123a. By forming the slit portion, the effect to relax warp of the wafer during the steps of manufacturing the semiconductor device improves. For example, as shown in FIG. 6, the slit portion 141 can be formed by making the thickness of the upper surface electrode 123 in the boundary between the second thickness region 123a and the first thickness region 123e to be thinner than the thickness of the first thickness region 123e by W3. In this case, it is preferable that the thickness (W1-W3) of the upper surface electrode 123 in the slit portion 141 is 1 μm or more.

In the example and in the modification described above, the second thickness region is rectangular in the plan view of the semiconductor device, but the shape of the second thickness region is not limited to a rectangle, but may be a circle, an ellipse, a triangle or another polygon, or may be an irregular shape. If a gate pad and a small signal pad such as a sense pad are formed on the upper surface of the semiconductor device, the gate pad or the small signal pad is the upper surface electrode having the first thickness region and the second thickness region according to the present invention, and the bonding wire may be bonded on the second thickness region. Furthermore, in the example and the modification, a case when a bonding wire is bonded to each one of the plurality of second thickness regions was described as an example, but bonding wires need not be bonded to all of the plurality of second thickness regions respectively.

While embodiments of the present invention have been described in detail, such embodiments are merely illustrative and are not intended to limit the scope of claims. Techniques described in the scope of claims include various modifications and changes made to the specific examples illustrated above.

It is to be understood that the technical elements described in the present description and the drawings exhibit technical usefulness solely or in various combinations thereof and shall not be limited to the combinations described in the claims at the time of filing. Furthermore, the techniques illustrated in the present description and the drawings are to achieve a plurality of objectives at the same time, whereby technical usefulness is exhibited by attaining any one of such objectives.

The invention claimed is:

1. A semiconductor device comprising:
a semiconductor substrate including an element region in which a semiconductor element is formed, and
an upper surface electrode formed on an upper surface of the element region of the semiconductor substrate, wherein
the upper surface electrode comprises a first thickness region and a second thickness region which is thicker than the first thickness region,
an upper surface of the first thickness region is lower than an upper surface of the second thickness region, and
a bonding wire is bonded on the second thickness region, and
a slit portion is provided at a boundary between the first thickness region and the second thickness region in the upper surface electrode.

2. The semiconductor device according to claim 1, wherein a thickness of the slit portion of the upper surface electrode is thinner than a thickness of the first thickness region of the upper surface electrode.

3. The semiconductor device according to claim 1, wherein the bonding wire is bonded to the upper surface electrode by an ultrasonic bonding.

* * * * *